(12) United States Patent
Sander

(10) Patent No.: US 6,975,004 B2
(45) Date of Patent: Dec. 13, 2005

(54) SEMICONDUCTOR COMPONENT WITH OPTIMIZED CURRENT DENSITY

(75) Inventor: Rainald Sander, München (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/317,974

(22) Filed: Dec. 12, 2002

(65) Prior Publication Data

US 2003/0107089 A1 Jun. 12, 2003

(30) Foreign Application Priority Data

Dec. 12, 2001 (DE) ................................ 101 61 125

(51) Int. Cl.[7] .................... H01L 29/76; H01L 29/94; H01L 31/062; H01L 31/113; H01L 31/119
(52) U.S. Cl. ................... 257/392; 257/390; 257/391; 257/368; 257/369
(58) Field of Search ................... 257/67, 369, 382, 257/390, 391, 392, 371, 368

(56) References Cited

U.S. PATENT DOCUMENTS

| | | | |
|---|---|---|---|
| 5,473,181 A | * 12/1995 | Schwalke et al. ........... 257/350 |
| 5,689,133 A | 11/1997 | Li et al. |
| 5,952,699 A | * 9/1999 | Yamazaki et al. .......... 257/404 |
| 6,184,555 B1 | * 2/2001 | Tihanyi et al. .............. 257/342 |
| 6,291,856 B1 | * 9/2001 | Miyasaka et al. .......... 257/335 |
| 6,475,864 B1 | * 11/2002 | Sato et al. .................. 438/268 |
| 6,479,327 B2 | * 11/2002 | Takahashi et al. ......... 438/124 |
| 6,495,421 B2 | * 12/2002 | Luo ........................... 438/269 |
| 2003/0052329 A1 | * 3/2003 | Kobayashi et al. ......... 257/135 |
| 2003/0060001 A1 | * 3/2003 | Disney ....................... 438/200 |

FOREIGN PATENT DOCUMENTS

| | | |
|---|---|---|
| DE | 1 614 784 | 12/1970 |
| EP | 0 859 414 A1 | 8/1998 |
| GB | 1 301 929 | 1/1973 |

* cited by examiner

*Primary Examiner*—Nathan J. Flynn
*Assistant Examiner*—Victor A. Mandala, Jr.
(74) *Attorney, Agent, or Firm*—Laurence A. Greenberg; Werner H. Stemer; Ralph E. Locher

(57) ABSTRACT

A cellularly constructed semiconductor component has a connection electrode, which contact-connects some of the cells, and a connection line, which contact-connects the connection electrode. In which case, in a region at a distance from a connection contact between the connection line and the connection electrode, at least some of the cells are not connected to the connection electrode.

7 Claims, 4 Drawing Sheets

SEMICONDUCTOR COMPONENT WITH OPTIMIZED CURRENT DENSITY

BACKGROUND OF THE INVENTION

Field of the Invention

The present invention relates to a semiconductor component having a multiplicity of identically constructed cells with each of the cells having a first connection zone. A connection electrode is provided for connecting the first connection zones of a plurality of the cells to one another. The semiconductor component further has a second connection zone.

An example of such a semiconductor component is a vertical MOS transistor of the SIPMOS family manufactured by applicant. In this known component, a plurality of identically constructed cells are present in the region of a front side of a semiconductor body. Each of the cells have a channel zone and, in the channel zone, a source zone of a complementary conductivity type with respect to the channel zone, the source zones forming first connection zones of the component. The channel zones are disposed in a drain zone which is doped complementarily with respect to the channel zones, which contains a more weakly doped drift zone and a more heavily doped substrate zone, and which forms a second connection zone of the component. In the case of the known component, the source zones are connected to a source electrode which is formed above a front side of the semiconductor body on an insulation layer and which contact-connects the source electrodes in contact holes of the insulation layer that are provided therefor. The interconnection of the source zones of the plurality of cells has the effect that a multiplicity of identically constructed transistors are connected in parallel in order thus to increase the current-carrying capacity of the component, which rises with the number of transistors connected in parallel. In addition to transistors, such a cellular construction is also found for example in diodes or thyristors.

For the electrical contact-connection of the component, it is known to electrically conductively connect a connection line, in particular a bonding wire, to the connection electrode in a region provided therefor. If a voltage is applied between the connection line and the second connection zone and if, in transistors and thyristors, the respective control electrodes are suitably driven, then a current flow arises from the connection wire via the connection electrode and the first connection zone to the second connection zone of the component. While the individual cells are usually distributed uniformly over the active semiconductor area of the component, a connection contact between the connection wire and the connection electrode takes up a small area relative to the total area. This has the effect that a current density in the connection electrode near the contact is large and decreases as the distance from the connection contact increases.

With regard to the temperature development, it should be taken into account that the temperature in the connection electrode is higher in the regions with a higher current density, that is to say near the connection contact, than in the regions with a lower current density, that is to say further away from the contact. In this case, the bonding wire additionally provides for heat dissipation, so that the temperature resulting from the current density is highest in a region at a distance from the connection contact and the cells disposed in this region are subject to the greatest thermal loading and thus the greatest risk of destruction. It can thus happen that some of the cells of the transistor are already destroyed owing to temperature damage, while others are still a long way from their maximum thermal loading capacity. These thermally highly loaded cells limit the maximum power consumption of the component.

SUMMARY OF THE INVENTION

It is accordingly an object of the invention to provide a semiconductor component with an optimized current density that overcomes the above-mentioned disadvantages of the prior art devices of this general type, which is able to take up a higher power nondestructively.

With the foregoing and other objects in view there is provided, in accordance with the invention, a semiconductor component. The semiconductor component contains a multiplicity of identically constructed cells having first connection zones, a connection electrode connecting the first connection zones of the cells to one another, a connection line connected to the connection electrode with a connection contact being defined between the connection line and the connection electrode, and at least one second connection zone. The semiconductor component has a region that is further away from the connection contact than a predetermined given distance, and in the region, a number of the cells per unit area of the semiconductor component having the first connection zones connected to the connection electrode being smaller than in other regions of the semiconductor component.

The semiconductor component according to the invention has a multiplicity of identically constructed cells with each of the cells having a first connection zone. A first connection electrode is provided for connecting the first connection zones of the plurality of cells to one another. A connection line is connected to the connection electrode, and a connection contact is formed between the connection line and the connection electrode. Finally, at least one second connection zone is provided. According to the invention, in a region, which is further away from the connection contact than a predetermined first distance, the number of cells per unit area of the semiconductor component whose first connection zone is connected to the first connection electrode is smaller than in other regions of the semiconductor component. In other words, the density of utilized cells relative to the area of the semiconductor component is lower in the aforementioned region in the case of the semiconductor component according to the invention.

In accordance with one embodiment of the invention, the reduction of the density of utilized cells, in the aforementioned region which is further away from the connection contact than a predetermined distance, is effected by virtue of the fact that the first connection zones of some cells in this region are not connected to the connection electrode and are thus not utilized in the case of the semiconductor component according to the invention.

A further exemplary embodiment of the invention provides for correspondingly fewer contact-connectable cells to be provided in this region.

The region in which the density of utilized cells is reduced corresponds to a region in which the thermal loading of the connection electrode has a maximum on account of the current density. The non-connection of some cells in this region or the provision of fewer cells per unit area now has the effect that the thermal loading that results in this region is not significantly higher than in the remaining regions of the semiconductor, as is explained briefly below.

The temperature in the semiconductor body results from the evolution of heat in the connection electrode, which is dependent on the current density, and from the current flow in the semiconductor body. Switching off some cells or providing fewer cells in a region in which the current density and thus the temperature development in the connection electrode is high has the effect that the temperature proportion resulting from the current flow in the semiconductor body is smaller compared with an embodiment in which all the cells are utilized or in which the density of utilized cells is the same at all points. When both effects are taken into account, namely the high evolution of heat on account of the current density in the connection electrode, and the lower evolution of heat in the semiconductor on account of the "switching off" of some cells or on account of the provision of fewer cells, the total thermal loading of the active semiconductor regions below regions of the connection electrode with a high current density is thus not significantly higher than in other regions of the semiconductor body.

Even though, in the semiconductor component according to the invention, the areal density of the utilized cells is lower in one region than in other regions and, in particular, some of the cells are not utilized, the resultant higher current loading on the remaining utilized cells does not lead to an increased component defect probability. On the contrary, the non-utilization of some cells in the region of high current density even has the effect that the remaining cells in the region are subjected to a less severe thermal loading than in the case of conventional components, so that the maximum loadability of the component is increased compared with conventional components. In the case of the component according to the invention, the power loss converted into heat is distributed uniformly over the entire component, so that an increase in power leads to a uniform rise in temperature. Unlike in the case of conventional components, there is no locally distinguished location at which a critical temperature would be reached particularly early with the temperature still being far from the critical region at another location.

The concept of the invention can be applied to all types of semiconductor components which have a cellular construction with a multiplicity of identical cells, that is to say for example transistors, diodes or thyristors.

One embodiment of the invention provides for every n-th cell in a region in which the temperature proportion resulting from the current density in the connection electrode reaches its maximum not to be connected to the connection electrode, where n is an integer and is preferably 1, 2, 3 or 4.

In accordance with an added feature of the invention, the region is formed annularly around the connection contact.

In accordance with another feature of the invention, the semiconductor component is a transistor and each of the cells has a channel zone disposed between a first connection zone and the second connection zone. Furthermore, a control electrode is disposed in a manner insulated from the first connection zones, the channel zone and the second connection zone.

In accordance with a concomitant feature of the invention, the semiconductor component is a diode and the first connection zones of the cells directly adjoin the second connection zone.

Other features which are considered as characteristic for the invention are set forth in the appended claims.

Although the invention is illustrated and described herein as embodied in a semiconductor component with optimized current density, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
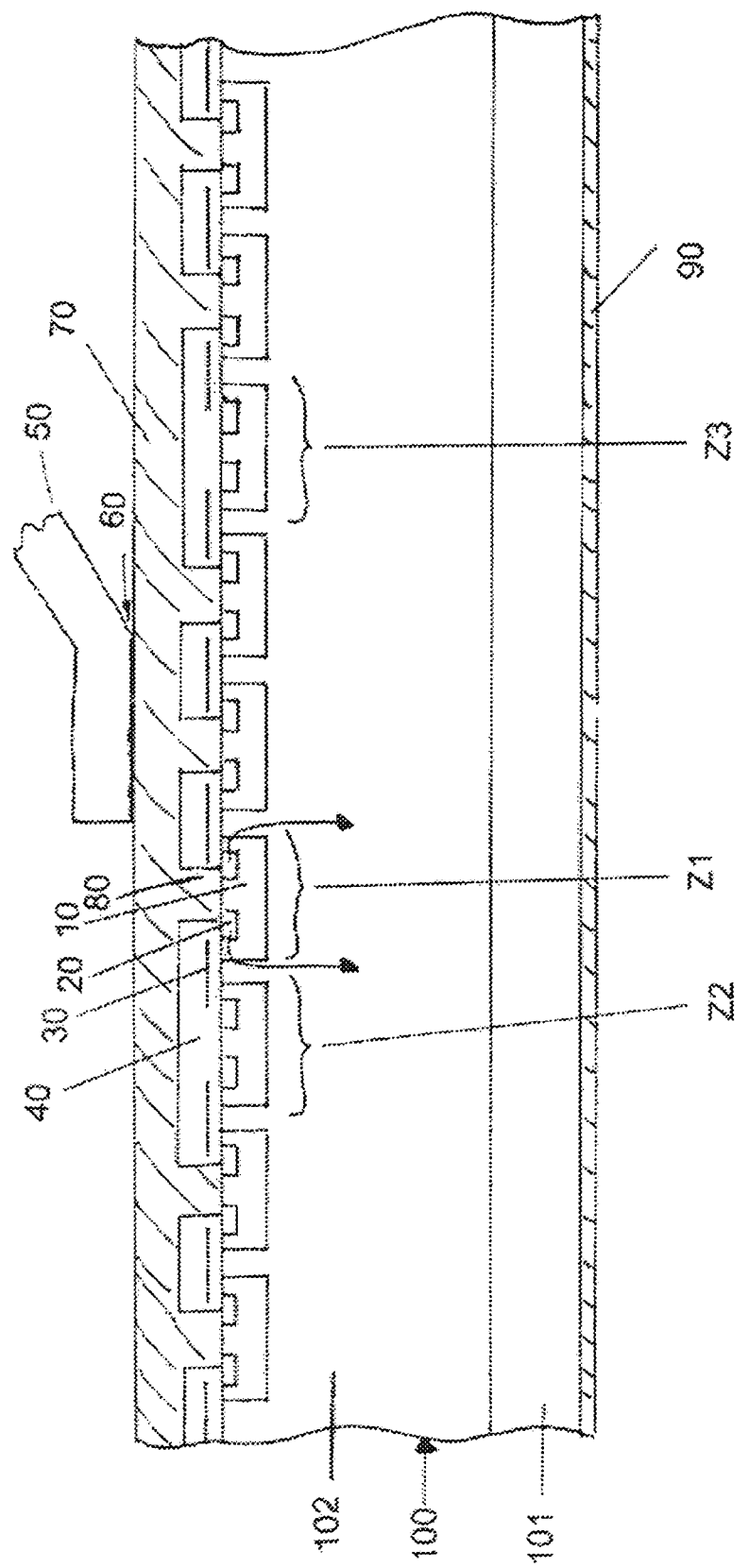
FIG. 1 is a diagrammatic, cross-sectional view through a semiconductor component configured as a vertical MOS transistor and according to the invention.

In all the figures of the drawing, sub-features and integral parts that correspond to one another bear the same reference symbol in each case. Referring now to the figures of the drawing in detail and first, particularly, to FIG. 1 thereof, there is shown a cellularly constructed semiconductor component according to the invention in side view in cross section, which component is configured as a vertical MOS transistor in the exemplary embodiment.

The component has a semiconductor body 100, which, in the example, has a heavily doped substrate zone 101 of a first conductivity type (n-doped in the case of an n-channel transistor and p-doped in the case of a p-channel transistor) and a more weakly doped drift zone 102 of the first conductivity type. In a region of a top side of the semiconductor body 100, a cellular structure is situated in the drift zone 102. Each cell Z1, Z2, Z3 has a channel zone 10 of a second conductivity type (p-doped in the case of an n-channel transistor and n-doped in the case of a p-channel transistor) that is complementary to the first conductivity type. Source zones 20 of the first conductivity type are formed in the channel zones 10 and serve as first connection zones of the component, the channel zones 10 in each case separating the source zones 20 from the drift zone 102.

In order to form a conducting channel between the source zones 20 and the drift zone 102, gate electrodes 30 are formed in an insulation layer 40 in a manner insulated from the semiconductor body 100 and each extend in the lateral direction from the source zones 20 across the drift zone 102.

The channel zones 10 and thus the cells are preferably made rectangular, circular or octagonal in plan view, the source zones 20 preferably being manifested as rings with a geometry corresponding to the channel zones, that is to say rectangular, circular or octagonal, as seen from a plan view.

For the contact-connection of the source zones 20, a source electrode 70 is applied to the insulation layer 40, which source electrode 70 contact-connects the source zones 20 of some cells via contact holes 80 provided therefor in the insulation layer 40. The source electrode 70 is in turn contact-connected by a connection line 50, in particular by a bonding wire, a connection contact 60 being formed between the connection line 50 and the source electrode 70. Both the source electrode 70 and the connection line 50 are preferably composed of a material that is a good electrical conductor, in particular a metal. As a drain electrode 90, a layer that is a good electrical conductor is applied to the substrate zone 101 in the region of a rear side of the semiconductor body 100. The source zones 20 form the first connection zones and the drain zone 101 with the drift zone 102 forms a second connection zone of the component.

As can be seen in FIG. 1, the transistor cells are distributed uniformly in the region of the top side of the semiconductor body 100. In contrast, the connection contact 60 between the connection line 50 and the source electrode 70 occupies a comparatively small area. When a voltage is applied between the connection line 50 and the drain electrode 90, with the gate electrodes 30 being driven, a current flow takes place between the source electrode 70 via the source zones 20, the channel zones 10, the drift zone 102 and the substrate zone/drain zone 101 to the drain electrode 90. In this case, the current density in the source electrode 70 decreases proceeding from the connection contact 60 with an increasing distance from the connection contact 60. As is known sufficiently well, the heating of an electrically conductive material increases on account of the nonreactive resistance inevitably present as the current density increases, so that the heating of the source electrode 70 is greatest in a region around the connection contact 60.

Figure 2:
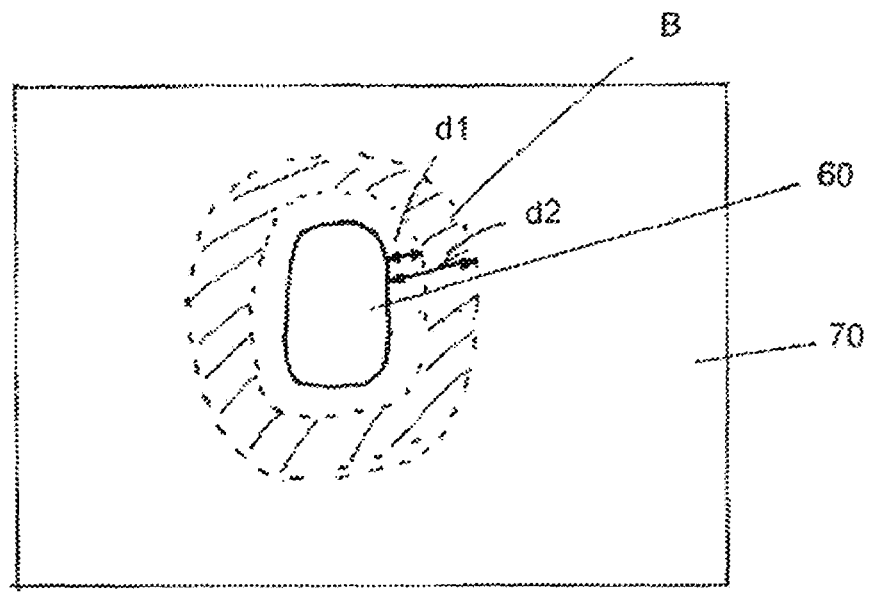
FIG. 2 is a diagrammatic, plan view of the semiconductor component according to the invention that illustrates a region around a connection contact in which cells are not utilized.

FIG. 2 shows the plan view of the source electrode 70 of a semiconductor component according to the invention with the connection contact 60, a region B with the greatest heating resulting from the current flow in the source electrode 70 being shown hatched. Even though the current density is greatest directly adjacent to the contact 60, the region of greatest heating begins at a distance d1 from the connection contact 60, since the connection line 50 promotes the dissipation of heat from the source electrode 70 in the vicinity of the connection contact 60. The heating of the source electrode that results from the current flow of the source electrode 70 is at a maximum in the region B and decreases outward as the current density decreases.

The invention now provides for a lower density of utilized cells to be provided in/below the region B of maximum heating of the source electrode 70, relative to the area of the semiconductor body 100, than in remaining regions of the semiconductor component. This is achieved in the case of the component in accordance with FIG. 1 by some of the cells, the cells Z2, Z3 in the example, not being connected to the source electrode 70, that is to say that the source zone 20 thereof is not connected to the source electrode 70, which leads to a thermal load relief of the cells connected to the source electrode 70 in the region B, as is explained below.

The temperature in the semiconductor body 100 in the region of the top side of the semiconductor body results, on the one hand, from the evolution of heat in the source electrode 70, i.e. from the current flow in the source electrode, and, on the other hand, from the current flow in the semiconductor body 100, which is illustrated diagrammatically for a cell Z1 by two arrows. The current flow in the semiconductor body leads to heating of the semiconductor body on account of nonreactive resistances that are unavoidably present. Not connecting some cells in a region in which the heating of the source electrode 70 is particularly high on account of a high current density reduces the rise in temperature resulting from resistive losses in the semiconductor body and thus provides for a thermal load relief of the cells that are connected to the source electrode 70 in the critical region. FIG. 1 diagrammatically shows two cells Z2, Z3 which are disposed at a distance from the connection contact 60 in the lateral direction and which are not connected to the source electrode 70, rather in the case of which the insulation layer 40 is present between the source zones 20 of the cells and the source electrode 70.

The semiconductor component according to the invention in accordance with FIG. 1 can be realized in a simple manner using conventional methods. One of the last steps in the production of a vertical semiconductor component of the type illustrated in FIG. 1 is the production of contact holes in the insulation layer 40 in order to be able to contact-connect the source zones 20. For the production of the semiconductor component according to the invention, it is necessary merely to use a suitable mask when producing the contact holes, which mask causes contact holes not to be produced in the insulation layer above the cells that are not to be connected.

Figure 4:
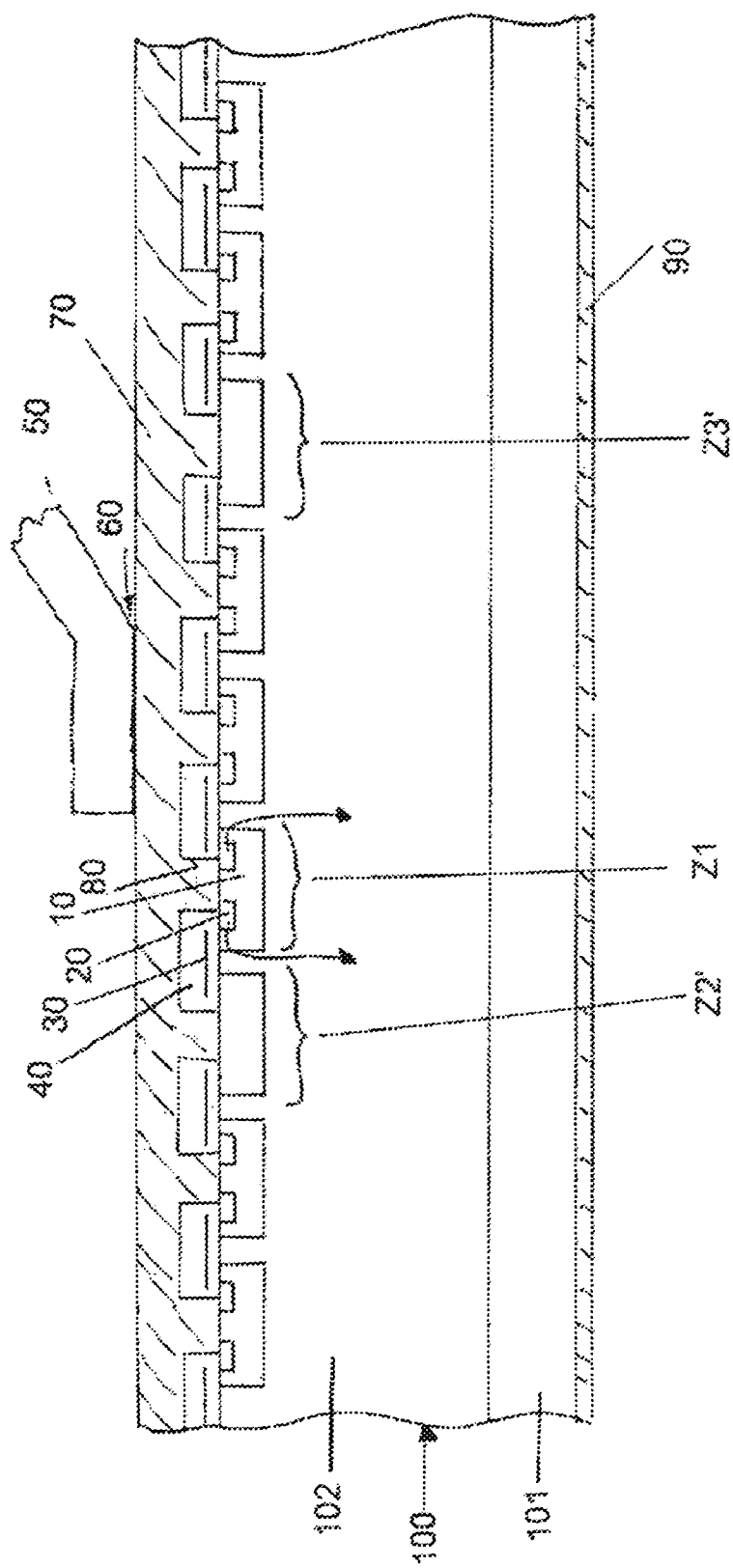
FIG. 4 is a diagrammatic, cross-sectional view through the semiconductor component according to the invention configured as a vertical MOS transistor in accordance with a further embodiment of the invention.

FIG. 4 shows a cross section through the semiconductor component according to the invention in accordance with a further embodiment, in which, relative to the area of the semiconductor body, a lower density of utilized cells is realized in a predetermined region by modified cells Z2', Z3' which do not have a source zone being provided in the region. This can be realized in the production of the component in that, during the method step in which the source zones 20 are produced in the channel zones 10, for example by an ion implantation, a suitable mask is used which prevents source zones from being produced in the modified cells Z2', Z3'. When producing the contact holes 80 in the insulation layer 40 during later method steps, it is then possible to use a conventional mask, so that the source electrode 70 contact-connects all the cells, including the modified cells Z2', Z3'. In this case, the modified cells Z2', Z3' act as diodes which, in the case of an n-channel transistor in which the drain zone 101 is n-doped and the channel zone is p-doped, are in the off state in the drain-source direction, that is to say the main direction of the transistor. It goes without saying that the contact-connection of the modified cells Z2', Z3' by the source electrode can also be omitted.

Figure 3:
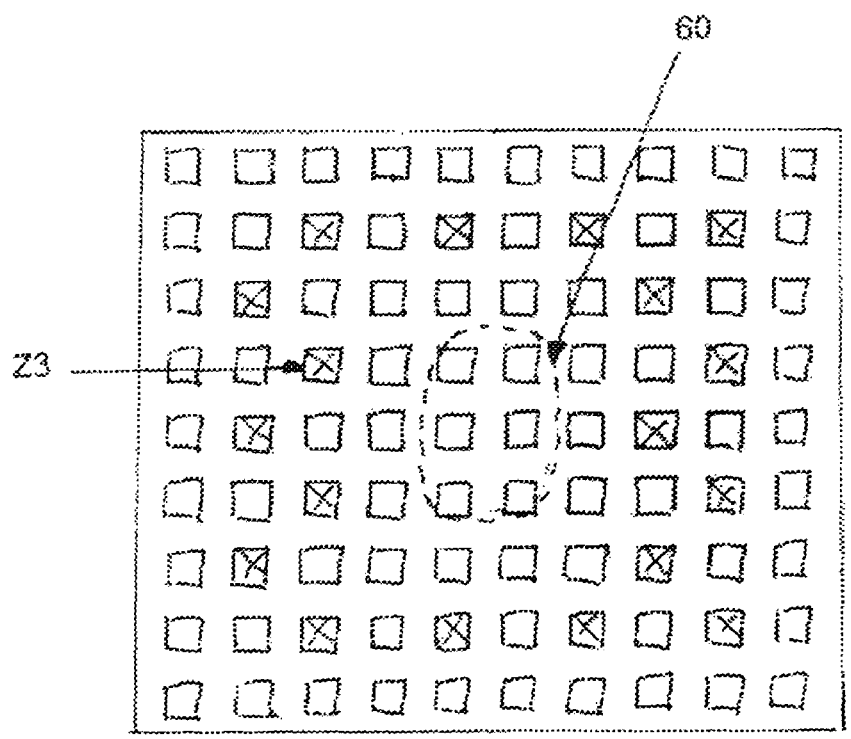
FIG. 3 is a cross-sectional view through the semiconductor component according to the invention showing non-utilized cells in the region around the connection contact being emphasized by crosses.

FIG. 3 shows, in plan view, a possible scheme for the selection of cells that are not to be connected, or of the cells which do not have a source zone. In the scheme illustrated in FIG. 3, in a region at a distance from the connection contact, which is shown dashed in FIG. 3, every second cell in each case is not connected to a source electrode that is not illustrated in FIG. 3. The non-connected cells or the cells without a source zone are marked by crosses in FIG. 3. It goes without saying that any other schemes for the selection of cells that are not to be connected are conceivable.

The semiconductor component according to the invention has been explained using a vertical power transistor in FIGS. 1 and 4. It goes without saying that the concept of the invention can be applied to any cellularly constructed semiconductor components such as, for example, diodes or thyristors.

Figure 5:
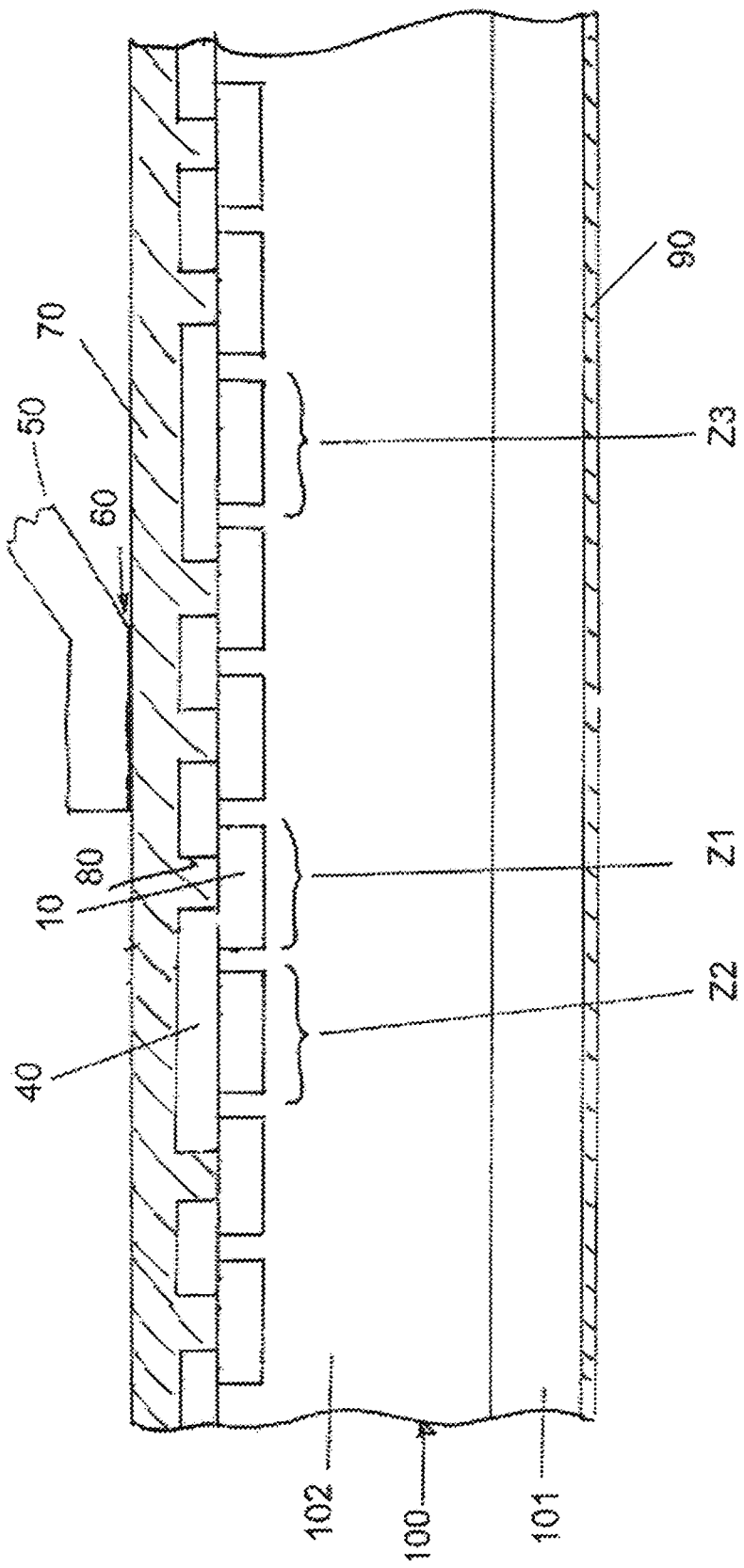
FIG. 5 is a diagrammatic, cross-sectional view through a semiconductor component configured as a cellularly constructed diode and according to the invention.

Thus, a cellularly constructed diode, as illustrated in FIG. 5, is obtained in a simple manner from the semiconductor component in accordance with FIG. 1 if the gate electrodes and the source zones are omitted, the zones designated as the channel zones in FIG. 1 forming the first connection zones of the component.

I claim:

1. A semiconductor component, comprising:
   a multiplicity of identically constructed cells having first connection zones;
   a connection electrode connecting said first connection zones of said cells to one another;
   a connection line connected to said connection electrode with a connection contact being defined between said connection line and said connection electrode; and
   at least one second connection zone;
   the semiconductor component having a region being further away from said connection contact than a predetermined given distance, and in said region, a number of said cells per unit area of the semiconductor component having said first connection zones connected to said connection electrode being smaller than in other regions of the semiconductor component;
   said first connection zones of at least some of said cells disposed in said region further away from said connection contact than the predetermined given distance not being connected to said connection electrode.

2. A semiconductor component, comprising:
   a multiplicity of identically constructed cells having first connection zones;
   a connection electrode connecting said first connection zones of said cells to one another;
   a connection line connected to said connection electrode with a connection contact being defined between said connection line and said connection electrode; and
   at least one second connection zone; the semiconductor component having a region being further away from said connection contact than a predetermined given distance, and in said region, a number of said cells per unit area of the semiconductor component having said first connection zones connected to said connection electrode being smaller than in other regions of the semiconductor component;
   a distance between said region and said connection contact being greater than the predetermined given distance but less than a predetermined further distance.

3. The semiconductor component according to claim 2, wherein said region is formed annularly around said connection contact.

4. A semiconductor component, comprising:
   a multiplicity of identically constructed cells having first connection zones;
   a connection electrode connecting said first connection zones of said cells to one another;
   a connection line connected to said connection electrode with a connection contact being defined between said connection line and said connection electrode; and
   at least one second connection zone; the semiconductor component having a region being further away from said connection contact than a predetermined given distance, and in said region, a number of said cells per unit area of the semiconductor component having said first connection zones connected to said connection electrode being smaller than in other regions of the semiconductor component;
   in said region, a respective first connection zone of every n-th cell being not connected to said connection electrode, where n is an integer greater than 1.

5. The semiconductor component according to claim 4, wherein n=1, 2, 3 or 4.

6. A semiconductor component, comprising;
   a multiplicity of identically constructed cells each having a first connection zone and a channel zone doped complementarily to said first connection zone;
   a number of modified cells each having a channel zone but without a first connection zone;
   a connection electrode connecting said first connection zones of said cells to one another;
   a connection line connected to said connection electrode with a connection contact being defined between said connection line and said connection electrode;
   at least one second connection zone connected to said channel zones of said cells and said modified cells, said second connection zone being a semiconductor zone doped complementarily to said channel zones; and
   said modified cells being contacted by said connection electrode, and said modified cells being disposed in a region of the semiconductor component being further away from said connection contact than a predetermined given distance.

7. The semiconductor component according to claim 6, wherein the semiconductor component is a transistor, and further comprising a control electrode disposed in a maimer insulated from said first connection zones, said channel zone and said second connection zone.

* * * * *